(12) United States Patent
Brooks

(10) Patent No.: US 6,621,728 B2
(45) Date of Patent: *Sep. 16, 2003

(54) METHOD OF WRITING A FOUR-TRANSISTOR MEMORY CELL ARRAY

(75) Inventor: Robert J Brooks, Fort Collins, CO (US)

(73) Assignee: Hewlett-Packard Development Company, LP., Houston, TX (US)

( * ) Notice: Subject to any disclaimer, the term of this patent is extended or adjusted under 35 U.S.C. 154(b) by 38 days.

This patent is subject to a terminal disclaimer.

(21) Appl. No.: 10/061,925

(22) Filed: Jan. 31, 2002

(65) Prior Publication Data

US 2003/0142536 A1 Jul. 31, 2003

(51) Int. Cl.⁷ .............................................. G11C 11/00
(52) U.S. Cl. ....................................... 365/154; 365/156
(58) Field of Search .................................. 365/154, 156

(56) References Cited

U.S. PATENT DOCUMENTS 6,552,924 B1 * 4/2003 Brooks et al. ............... 365/154
2002/0131294 A1 * 9/2002 Forbes ......................... 365/154

* cited by examiner

Primary Examiner—Huan Hoang
(74) Attorney, Agent, or Firm—Alexander J. Neudeck

(57) ABSTRACT

A pair of cross-coupled inverters that hold a digital state are powered by supplies that also function as row select and column bit lines. A method of reading and writing the digital state of an individual cell, row of cells, or column of cells by manipulating these row-supply or column-supply lines. Reads and writes may be performed on either a row or column basis. A method for reading and logically OR'ing or AND'ing an entire row or column of cells. A method for querying on a row or column basis to function as a content addressable memory (CAM).

27 Claims, 17 Drawing Sheets

METHOD OF WRITING A FOUR-TRANSISTOR MEMORY CELL ARRAY

CROSS-REFERENCE TO RELATED APPLICATIONS

A number of related copending United States patent applications commonly owned by the assignee of the present document and incorporated by reference in their entirety into this document is being filed in the United States Patent and Trademark Office on or about the same day as the present application. These related applications are: Ser. No. 10/061, 917, titled "A FOUR-TRANSISTOR STATIC MEMORY CELL ARRAY"; Ser. No. 10/062,074, titled "A METHOD OF READING A FOUR-TRANSISTOR MEMORY CELL ARRAY"; Ser. No. 10/061,876, titled "A METHOD OF READING AND LOGICALLY OR'ING OR ANDING A FOUR-TRANSISTOR MEMORY CELL ARRAY BY ROWS OR COLUMNS"; and, Ser. No. 10/062,053, titled "A METHOD OF QUERYING A FOUR-TRANSISTOR MEMORY ARRAY LIKE A CONTENT-ADDRESSABLE-MEMORY BY ROWS OR COLUMNS".

FIELD OF THE INVENTION

This invention relates generally to CMOS integrated circuits and more particularly to circuits for storing digital data.

SUMMARY OF THE INVENTION

A pair of cross-coupled inverters that hold a digital state are powered by supplies that also function as row select and column bit lines. A first voltage differential between a pair of supply lines for the rows and a second voltage differential between a pair of supply lines for the columns are applied simultaneously to change the state of the cell.

DETAILED DESCRIPTION OF THE PREFERRED EMBODIMENTS

Figure 1:
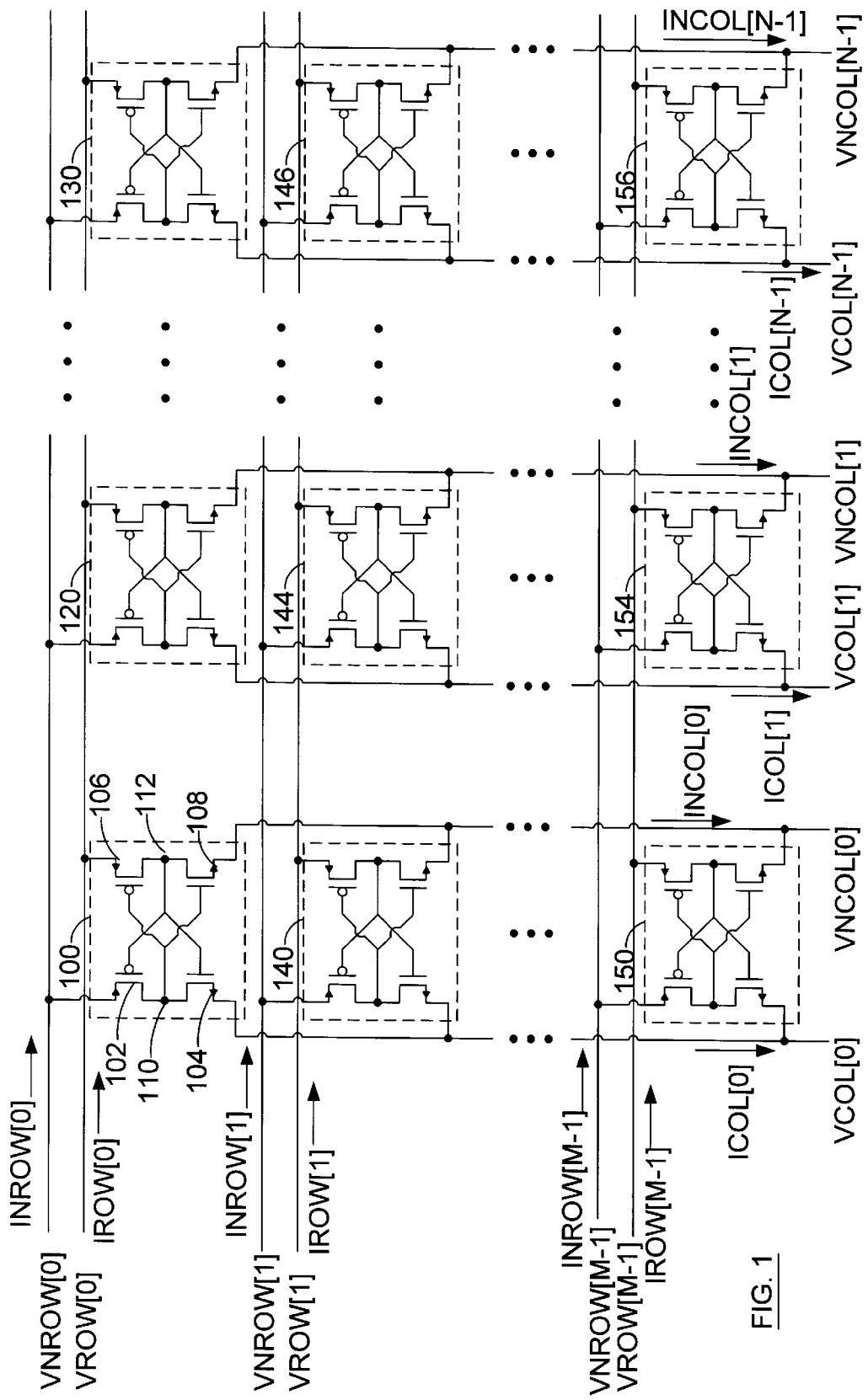
FIG. 1 is a schematic illustration of an M×N array of four-transistor memory cells.

FIG. 1 is a schematic illustration of an array of four-transistor memory cells arranged in M rows and N columns. In this document, the designation of rows and columns is arbitrary, may be exchanged, and does not imply any particular geometry or arrangement. These designations are used only for illustrative purposes. In FIG. 1, a four-transistor cell 100, 120, 130, 140, 144, 146, 150, 154, 156 is shown repeated N times in each row, and M times in each column. This forms an M×N array that may be used as a random access memory (RAM).

Four-transistor memory cell 100, which is identical to all the other cells in the M×N array, is comprised of n-channel field effect transistors (NFETs) 104 and 108 and p-channel field effect transistors (PFETs) 102 and 106. PFET 102 and NFET 104 comprise a first inverter that is cross-coupled to a second inverter comprising PFET 106 and NFET 108. The first inverter has an output node 110 that is connected to the drains of PFET 102 and NFET 104. The second inverter has an output node 112 that is connected to the drains of PFET 106 and NFET 108. The output node of the first inverter 110 is connected to the input of the second inverter (i.e. the gates of PFET 106 and NFET 108). The output node of the second inverter 112 is connected to the input of the first inverter (i.e. the gates of PFET 102 and NFET 104). This connection of outputs to inputs forms a cross-coupling of the first and second inverters. The cross-coupled connection of the first and second inverters of all the cells in the array 100, 120, 130, 140, 144, 146, 150, 154, 156 form circuits that each store a digital state, or bit.

Using cell 100 as a representative example of the rest of the cells of the array, the positive supply voltage for the first inverter of a cell is supplied to the source of PFET 102. Accordingly, the source of PFET 102 will also be referred to as the positive supply node for the first inverter. The negative supply voltage for the first inverter is supplied to the source of NFET 104. Accordingly, the source of NFET 104 will also be referred to as the negative supply node for the first inverter. The positive supply voltage for the second inverter is supplied to the source of PFET 106. Accordingly, the source of PFET 106 will also be referred to as the positive supply node for the second inverter. The negative supply voltage for the second inverter is supplied to the source of NFET 108. Accordingly, the source of NFET 108 will also be referred to as the negative supply node for the second inverter. Note that the first and second inverters of any given cell do not share either a positive supply line or a negative supply line.

In the array, the positive supply nodes for the individual first and second inverters in a four-transistor cell are connected to separate row-supply lines. This is shown in FIG.

1 where cells 100, 120, and 130 have the positive supply node for their respective first inverters connected to row-supply line VNROW[0] and the positive supply node for their respective second inverters connected to VROW[0]; and where cells 140, 144, and 146 have the positive supply node for their respective first inverters connected to VNROW[1] and the positive supply node for their respective second inverters connected to VROW[1]; and where cells 150, 154, and 156 have the positive supply node for their respective first inverters connected to VNROW[M−1] and the positive supply node for their respective second inverters connected to VROW[M−1].

The negative supply lines for the individual first and second inverters in a four-transistor cell are connected to separate column-supply lines. This is shown in FIG. 1 where cells 100, 140, and 150 have the negative supply node for their respective first inverters connected to VCOL[0] and the negative supply node for their respective second inverters connected to VNCOL[0]; and where cells 120, 144, and 154 have the negative supply node for their respective first inverters connected to VCOL[1] and the negative supply node for their respective second inverters connected to VNCOL[1]; and where cells 130, 146, and 156 have the negative supply node for their respective first inverters connected to VCOL[N−1] and the negative supply node for their respective second inverters connected to VNCOL[N−1].

For a given cell, when the voltages on the positive row-supply lines (i.e. VNROW[0:M−1] and VROW[0:M−1]) and the voltages on the negative column-supply lines (i.e. VCOL[0:N−1] and VNCOL[0:N−1]) are kept at a sufficiently large difference from each other (for example, VNROW[0] and VROW[0] at the same voltage but 3.3 volts difference from VCOL[0] and VNCOL[0]) the cross-coupled inverters in each state hold a digital state, or bit. However, these voltages may be manipulated to read, or write the data in a cell, or group of cells.

Figure 2:
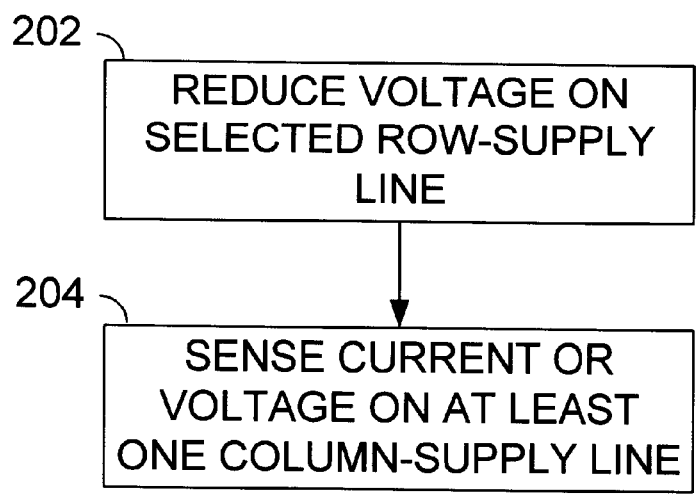
FIG. 2 illustrates steps that may be used to read the data in a cell or row of cells.

FIG. 2 illustrates steps that may be used to read the data in a cell or row of cells. Cell 100 and its row-supply and column-supply lines will be used in the discussion of all the figures as a representative cell. However, this is for discussion purposes only and it should be understood that all the cells, rows, and columns function substantially the same. Also note that in this discussion the row-supply lines VROW[ ] are varied resulting in detectable changes on VCOL[ ] column-supply lines. This is also just for discussion purposes only and it should be understood that the VNROW[ ] row-supply lines could have been manipulated resulting in detectable changes on the VNCOL[ ] column-supply lines.

In FIG. 2, in a step 202 the voltage is reduced on a selected row-supply line. For example, to read the cells in the top row of FIG. 1, 100, 120, 130, the voltage on row-supply line VROW[0] would be reduced relative to the voltage on row-supply line VNROW[0] by at least the threshold voltage of the PFETs. The other row-supply lines VROW[1:M−1] and VNROW[1:M−1] would all be maintained at a supply-like voltage (for example, the 3.3V difference from the column-supply lines mentioned above).

If the first inverter 102, 104 is driving a one (i.e. NFET 104 is off and PFET 102 is on) and the second inverter 106, 108 is driving a zero (i.e. NFET 108 is on and PFET 106 is off) then the reduced voltage on VROW[0] has no effect on cell 100 because the reduced voltage on VROW[0] is not passed from VROW[0] to the output node of the second inverter 112 because PFET 106 is off. Accordingly, little or no change in the current flowing out of VCOL[0] (ICOL[0]) and VNCOL[0] (INCOL[0]) would occur and these currents ICOL[0] and INCOL[0] would be approximately the same.

In a step 204, this lack of change, or the similar magnitudes of ICOL[0] and INCOL[0], is sensed by a sense circuit connected to at least VCOL[0] to read the state of the inverters in cell 100. For example, if the first inverter driving a one is defined as cell 100 holding a zero, then this lack of change, or the similar magnitudes of ICOL[0] and INCOL[0], may be detected by a sense circuit which would then output an indication that the state of cell 100 was a zero.

If the first inverter 102, 104 is driving a zero (i.e. NFET 104 is on and PFET 102 is off) and the second inverter 106, 108 is driving a one (i.e. NFET 108 is off and PFET 106 is on) then the reduced voltage on VROW[0] is passed from VROW[0] to the output node of the second inverter 112 via PFET 106. This causes the voltage between the gate of PFET 102 and the source of PFET 102 to exceed the PFET threshold voltage ($V_{TP}$) causing PFET 102 to turn on. As long as the voltage on the output node of the second inverter remains an NFET threshold voltage ($V_{TN}$) above VCOL[0], then NFET 104 will remain on. This allows current to flow from VNROW[0] through PFET 102 and NFET 104 to VCOL[0]. Accordingly, this causes a change (increase) in the current flowing out of VCOL[0] (ICOL[0]) and but not the current flowing out of VNCOL[0] (INCOL[0]). Therefore the currents ICOL[0] and INCOL[0] would not be approximately the same.

In a step 204, this change, or the different magnitudes of ICOL[0] and INCOL[0], is sensed by a sense circuit connected to at least VCOL[0] to read the state of the inverters in cell 100. For example, if the first inverter driving a zero is defined as cell 100 holding a one, then the change in ICOL[0], or the difference in magnitudes of ICOL[0] and INCOL[0], may be detected by a sense circuit which would then output an indication that the state of cell 100 was a one.

If ICOL[0] and/or INCOL[0] are passed through an impedance, or allowed to charge a capacitive node, the differences in, or changes to ICOL[0] and INCOL[0] would manifest themselves as voltage differences. Accordingly, the state of a cell may also be detected by sensing a voltage.

Figure 3:
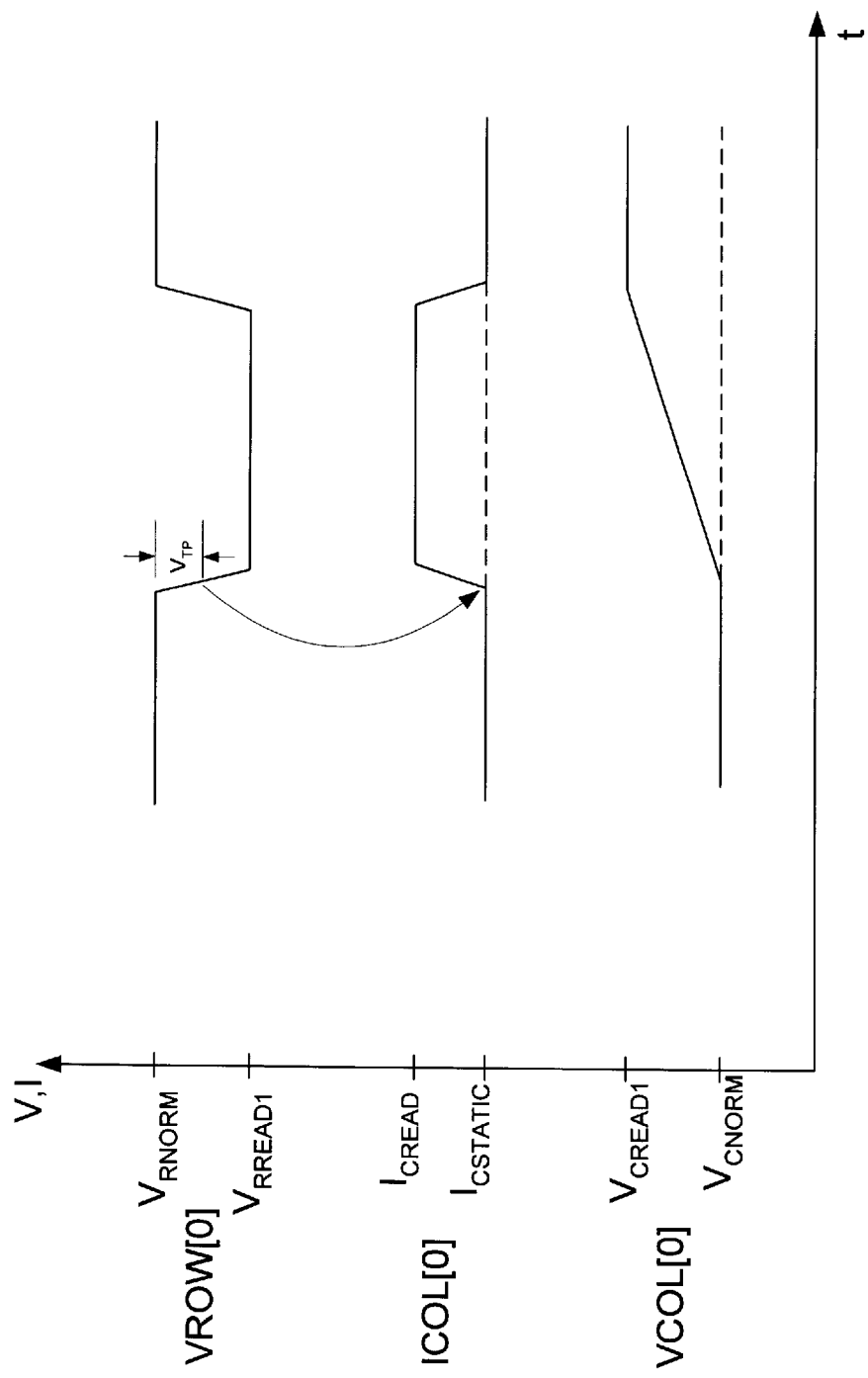
FIG. 3 illustrates representative row-supply and column-supply waveforms during a read of a cell or row of cells.

FIG. 3 illustrates representative row-supply and column-supply waveforms during a read of a cell or row of cells. In FIG. 3, VROW[0] starts at its normal operating voltage $V_{RNORM}$. When measuring this voltage with respect to the column-supply lines VCOL[0:M−1] and VNCOL[0:M−1] $V_{RNORM}$ should be high enough that only one of the FETs in each of the first and second inverters in any cell is on at any one time. This reduces power consumption and ensures that the current flowing out of the column-supply lines ICOL[0:N−1] and INCOL[0:N−1] is minimized. Minimizing the current flowing out of the column supply lines makes it is easier to detect voltage and/or current changes on these lines when a cell or multiple cells are being read.

After starting at $V_{RNORM}$ VROW[0] is then shown dropping to a second voltage, $V_{RREAD1}$. $V_{RREAD1}$ is a voltage that is low enough to turn on one of the PFETs of a cell when the other row-supply line for that cell is kept at $V_{RNORM}$. That means that $V_{RREAD1}$ should be at least a PFET threshold voltage lower that $V_{RNORM}$. After a period of time, VROW[0] is then shown returning from $V_{RREAD1}$ to $V_{RNORM}$. The current flowing out of column-supply line VCOL[0], ICOL[0] is shown at $I_{CSTATIC}$ at the start when VROW[0] is at $V_{RNORM}$. Then, shortly after VROW[0] drops by at least $V_{TP}$, ICOL[0] will either rise to $I_{CREAD}$ (as shown by the solid line) or stay approximately the same (as shown by the dashed line) depending upon the state of cell 100. When VROW[0] returns to $V_{RNORM}$, the solid line returns to the $I_{CSTATIC}$ level.

As stated earlier, if ICOL[0] is run through an impedance, or allowed to charge a capacitance such as is on the column-supply line VCOL[0], it may produce a detectable voltage change or difference on the VCOL[ ] or VNCOL[ ] lines. One possible voltage waveform is labeled VCOL[0] in FIG. 3. This waveform starts at $V_{CNORM}$, and rises to a read level, $V_{CREAD1}$ if ICOL[0] rose to $I_{CREAD}$. VCOL[0] may be clamped to limit its rise to just$V_{CREAD1}$. If ICOL[0] remained at $I_{CSTATIC}$, then VCOL[0] is shown (by the dashed line) staying at $V_{CNORM}$.

Figure 4:
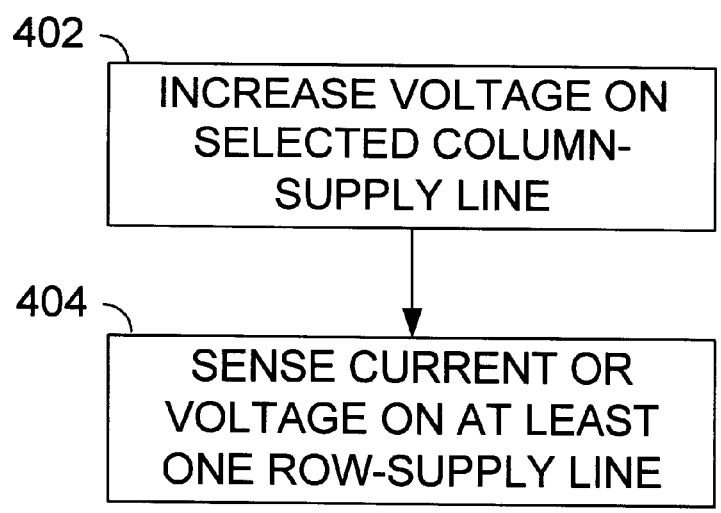
FIG. 4 illustrates steps that may be used to read the data in a cell or column of cells.

FIG. 4 illustrates steps that may be used to read the data in a cell or column of cells. Note that in this discussion the column-supply lines VCOL[ ] are varied resulting in detectable changes on VROW[ ] row-supply lines. This is also just for discussion purposes only and it should be understood that the VNCOL[ ] column-supply lines could have been manipulated resulting in detectable changes on the VNROW[ ] row-supply lines.

In FIG. 4, in a step 402 the voltage is increased on a selected column-supply line. For example, to read the cells in the leftmost hand column of FIG. 1, 100, 140, 150, the voltage on column-supply line VCOL[0] would be increased relative to the voltage on column-supply line VNCOL[0] by at least the threshold voltage of the NFETs. The other column-supply lines VCOL[1:M−1] and VNCOL[1:M−1] would all be maintained at a supply-like voltage (for example, ground, or a 3.3V difference from the row-supply lines mentioned above).

If the first inverter 102, 104 is driving a one (i.e. NFET 104 is off and PFET 102 is on) and the second inverter 106, 108 is driving a zero (i.e. NFET 108 is on and PFET 106 is off) then the increased voltage on VCOL[0] has no effect because on cell 100 because the increased voltage on VCOL[0] is not passed from VCOL[0] to the output node of the first inverter 110 because NFET 104 is off. Accordingly, little or no change in the current flowing into VROW[0] (IROW[0]) and VNROW[0] (INROW[0]) would occur and these currents IROW[0] and INROW[0] would be approximately the same.

In a step 404, this lack of change, or the similar magnitudes of IROW[0] and INROW[0], is sensed by a sense circuit connected to at least VROW[0] to read the state of the inverters in cell 100. For example, if the first inverter driving a one is defined as cell 100 holding a zero, then this lack of change, or the similar magnitudes of IROW[0] and INROW [0], may be detected by a sense circuit which would then output an indication that the state of cell 100 was a zero.

If the first inverter 102, 104 is driving a zero (i.e. NFET 104 is on and PFET 102 is off) and the second inverter 106, 108 is driving a one (i.e. NFET 108 is off and PFET 106 is on) then the increased voltage on VCOL[0] is passed from VCOL[0] to the output node of the first inverter 110 via NFET 104. This causes the voltage between the gate of NFET 108 and the source of NFET 108 to exceed the NFET threshold voltage ($V_{TN}$) causing NFET 108 to turn on. As long as the voltage on the output node of the second inverter remains a PFET threshold voltage ($V_{TP}$) below VROW[0], then PFET 106 will remain on. This allows current to flow from VROW[0] through PFET 106 and NFET 108 to VNCOL[0]. Accordingly, this causes a change (increase) in the current flowing into VROW[0] (IROW[0]) but not the current flowing out of VNROW[0] (INROW[0]). Therefore the currents IROW[0] and INROW[0] would not be approximately the same.

In a step 404, this change, or the different magnitudes of IROW[0] and INROW[0], is sensed by a sense circuit connected to at least VROW[0] to read the state of the inverters in cell 100. For example, if the first inverter driving a zero is defined as cell 100 holding a one, then the change in IROW[0], or the difference in magnitudes of IROW[0] and INROW[0], may be detected by a sense circuit which would then output an indication that the state of cell 100 was a one.

If IROW[0] and/or INROW [0] are passed through an impedance, or allowed to discharge a capacitive node, the differences in, or changes to IROW[0] and INROW[0] would manifest themselves as voltage differences. Accordingly, the state of a cell may also be detected by sensing a voltage.

Figure 5:
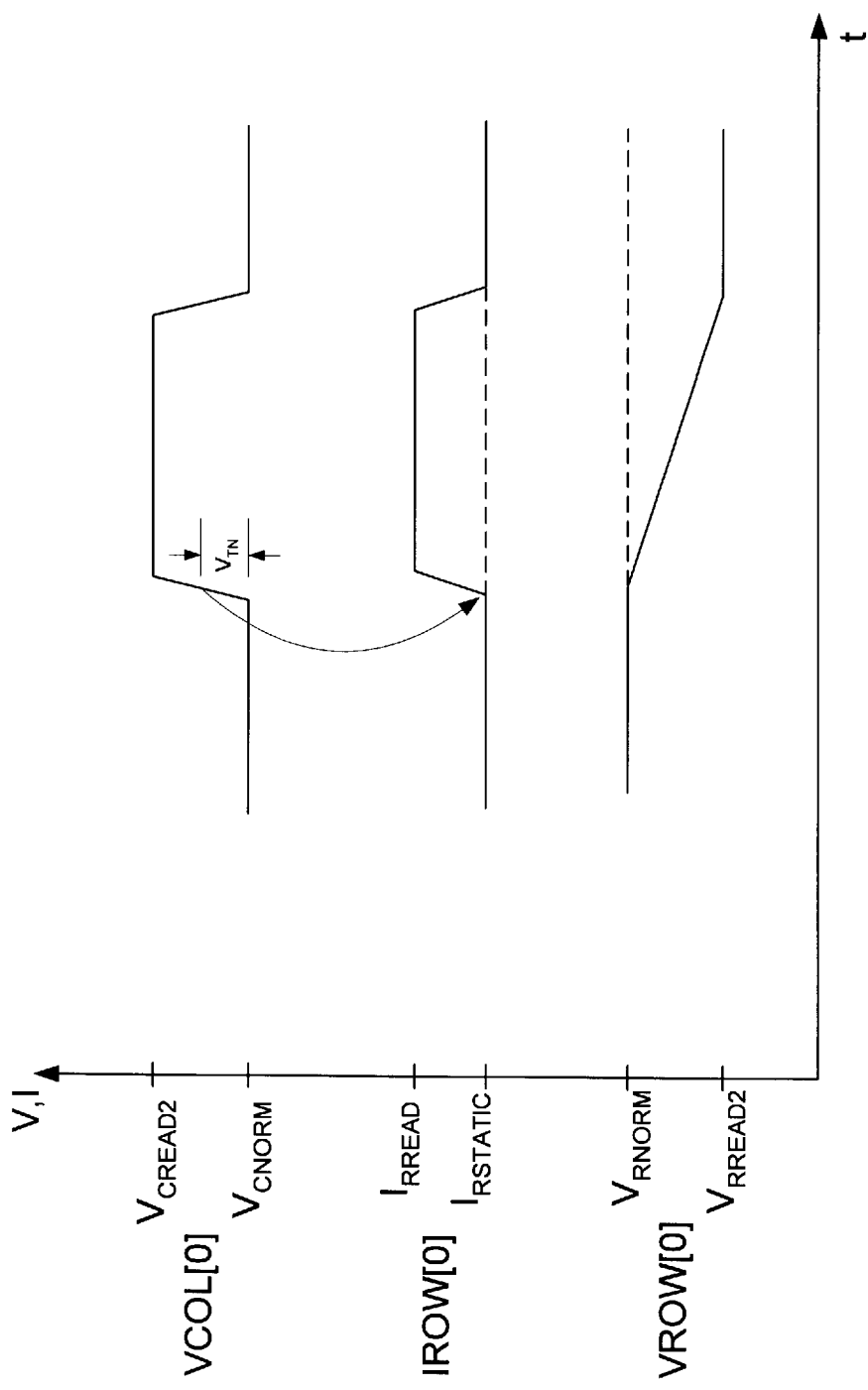
FIG. 5 illustrates representative row-supply and column-supply waveforms during a read of a cell or column of cells.

FIG. 5 illustrates representative row-supply and column-supply waveforms during a read of a cell or column of cells. In FIG. 5, VCOL[0] starts at its normal operating voltage $V_{CNORM}$ When measuring this voltage with respect to the row-supply lines VROW[0:M−1] and VNROW[0:M−1] $V_{cNORM}$ should be low enough that only one of the FETs in each of the first and second inverters in any cell is on at any one time. This reduces power consumption and ensures that the current flowing into of the row-supply lines IROW[0:N−1] and INROW[0:N−1] is minimized. Minimizing the current flowing into the row-supply lines makes it is easier to detect voltage and/or current changes on these lines when a cell or multiple cells are being read.

After starting at $V_{CNORM}$ VCOL[0] is then shown rising to a second voltage, $V_{CREAD2}$ $V_{CREAD2}$ is a voltage that is high enough to turn on one of the NFETs of a cell when the other column-supply line for that cell is kept at $V_{CNORM}$ That means that $V_{CREAD2}$ should be at least a NFET threshold voltage higher than $V_{CNORM}$. After a period of time, VCOL[0] is then shown returning from $V_{CREAD2}$ to $V_{CNORM}$. The current flowing into row-supply line VROW [0], IROW[0] is shown at $I_{RSTATIC}$ at the start when VCOL [0] is at $V_{CNORM}$. Then, shortly after VCOL[0] rises by at least $V_{TN}$, IROW[0] will either rise to $I_{RREAD}$ (as shown by the solid line) or stay approximately the same (as shown by the dashed line) depending upon the state of cell 100. When VCOL[0] returns to $V_{CNORM}$, the solid line returns to the $I_{RSTATIC}$ level.

As stated earlier, if IROW[0] is run through an impedance, or allowed to discharge a capacitance such as is on the row-supply line VROWL[0], it may produce a detectable voltage change or difference on the VROW[ ] or VNROW[ ] lines. One possible voltage waveform is labeled VROW[0] in FIG. 5. This waveform starts at $V_{RNORM}$, and drops to a read level, $V_{RREAD2}$ if IROW[0] rose to $I_{RREAD}$. VROWL[0] may be clamped to limit its fall to just $V_{RREAD1}$. If IROW[0] remained at $I_{RSTATIC}$, then VROW[0] is shown (by the dashed line) staying at $V_{RNORM}$ To read a row of cells, either a VROW or VNROW line is reduced in voltage and the current or voltage on the VCOL or VNCOL lines is measured to detect the state of each cell in the row of cells addressed by the reduced VROW or VNROW line. To read a column of cells, either a VCOL or VNCOL line is increased in voltage and the current or voltage on the VROW or VNROW lines is measured to detect the state of each cell in the column of cells addressed by the increased VCOL or VNCOL line. Note that the process for accessing a row of cells and for accessing a column of cells, in the array itself, require the same hardware. This is unlike conventional six-transistor memory arrays that have certain transistors in each cell dedicated to accessing either a column, or a row, but not both. Accordingly, the array of four-transistor memory cells may be accessed on either a column or row basis.

Figure 6:
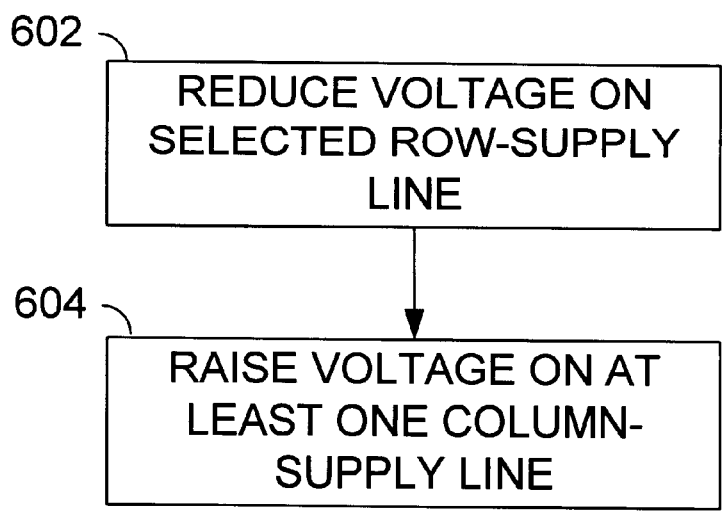
FIG. 6 illustrates steps that may be used to write the data in a cell or row of cells.

FIG. 6 illustrates steps that may be used to write the data in a cell or row of cells. In FIG. 6, in a step 602 the voltage is reduced on a selected row-supply line. For example, to write a first state (i.e. the first inverter 102, 104 driving a one and the second inverter driving a zero) into some or all of the cells in the top row of FIG. 1, 100, 120, 130, the voltage on row-supply line VROW[0] would be reduced relative to the voltage on row-supply line VNROW[0] by at least the threshold voltage of the PFETs. The other (non-selected) row-supply lines VROW[1:M−1] and VNROW[1:M−1] would all be maintained at a supply-like voltage (for example, the 3.3V difference from the column-supply lines mentioned above).

Using cell 100 as an example, if the first inverter 102, 104 is driving a zero (i.e. NFET 104 is on and PFET 102 is off) and the second inverter 106, 108 is driving a one (i.e. NFET 108 is off and PFET 106 is on) then the reduced voltage on VROW[0] is passed from VROW[0] to the output node of the second inverter 112 via PFET 106. This causes the voltage between the gate of PFET 102 and the source of PFET 102 to exceed the PFET threshold voltage ($V_{TP}$) causing PFET 102 to turn on. PFET 102 turning on causes the voltage on the output node of the first inverter 110 to rise. In the case of a read of the cell, above, this voltage is not allowed to rise enough to flip the state of the cell. However, in the case of a write, the voltage rise on node 110 is increased by raising the voltage, or allowing the voltage to raise, in a step 604 on the appropriate VCOL[ ] lines (VCOL[0] is the appropriate line to write this first state into cell 100, VCOL[1] for cell 120, etc.) such that the voltage on the output node of the first inverter 110 exceeds the trip-point of the second inverter. This flips the state of the cell into a second state where the second inverter is now driving a zero and the first inverter is now driving a one. Note that the voltage increase on the VCOL[ ] lines does not need to be extraordinarily large because the trip point of the second inverter has been reduced due to its reduced supply voltage and because PFET 102 is fighting against NFET 104 and raising the VCOL[ ] line decreases the ability of NFET 104 to win that fight. In the non-selected rows, these factors are not present so they are not affected by the rise on the VCOL[ ] line or lines. Note also that if, for a particular cell or group of cells in the selected row, it is not desired to set them in this first state, step 604 is not performed on those cells and they will maintain their original value as will all the cells in the non-selected rows.

If the first inverter 102, 104 were already driving a one (i.e. NFET 104 is off and PFET 102 is on) and the second inverter 106, 108 is driving a zero (i.e. NFET 108 is on and PFET 106 is off) then the reduced voltage on VROW[0] has no effect on cell 100 because the reduced voltage on VROW[0] is not passed from VROW[0] to the output node of the second inverter 112 because PFET 106 is off and the increased voltage on VCOL[0] is not passed to the output node of the first inverter 110 because NFET 104 is also off.

In order to write a second state (i.e. the first inverter 102, 104 driving a zero and the second inverter driving a one) into some or all of the cells in the top row of FIG. 1, 100, 120, 130, the process described above is followed except that the voltage on row-supply line VNROW[0] would be reduced relative to the voltage on row-supply line VROW[0] (instead of the other way around) by at least the threshold voltage of the PFETs in step 602. The other (non-selected) row-supply lines VROW[1:M−1] and VNROW[1:M−1] would still all be maintained at a supply-like voltage. Then in step 604, the column-supply line that is raised, or allowed to rise, in order to set the cell 100 in this second state would be VNCOL[0] (instead of VCOL[0]).

Since different row-supply and column-supply lines need to be manipulated to write the first state and second state into cells in the same row, a two-step process may be used to write arbitrary data into multiple cells of a row. To write this arbitrary data, all the cells that are to contain one state (for example, the first state) are written, then all the cells that are to contain the other state (for example, the second state) are written. The advantage of this two-step process is that it allows arbitrary data to be written into only portions of a row. For example, to write only one byte (or nibble, or word, or arbitrary bits, etc.), the two step process would be performed only on the cells of that byte. The column-supply lines for the other cells would not be manipulated and would therefore retain their original values. This is unlike many conventional RAM array that must perform write operations on whole rows.

Figure 7:
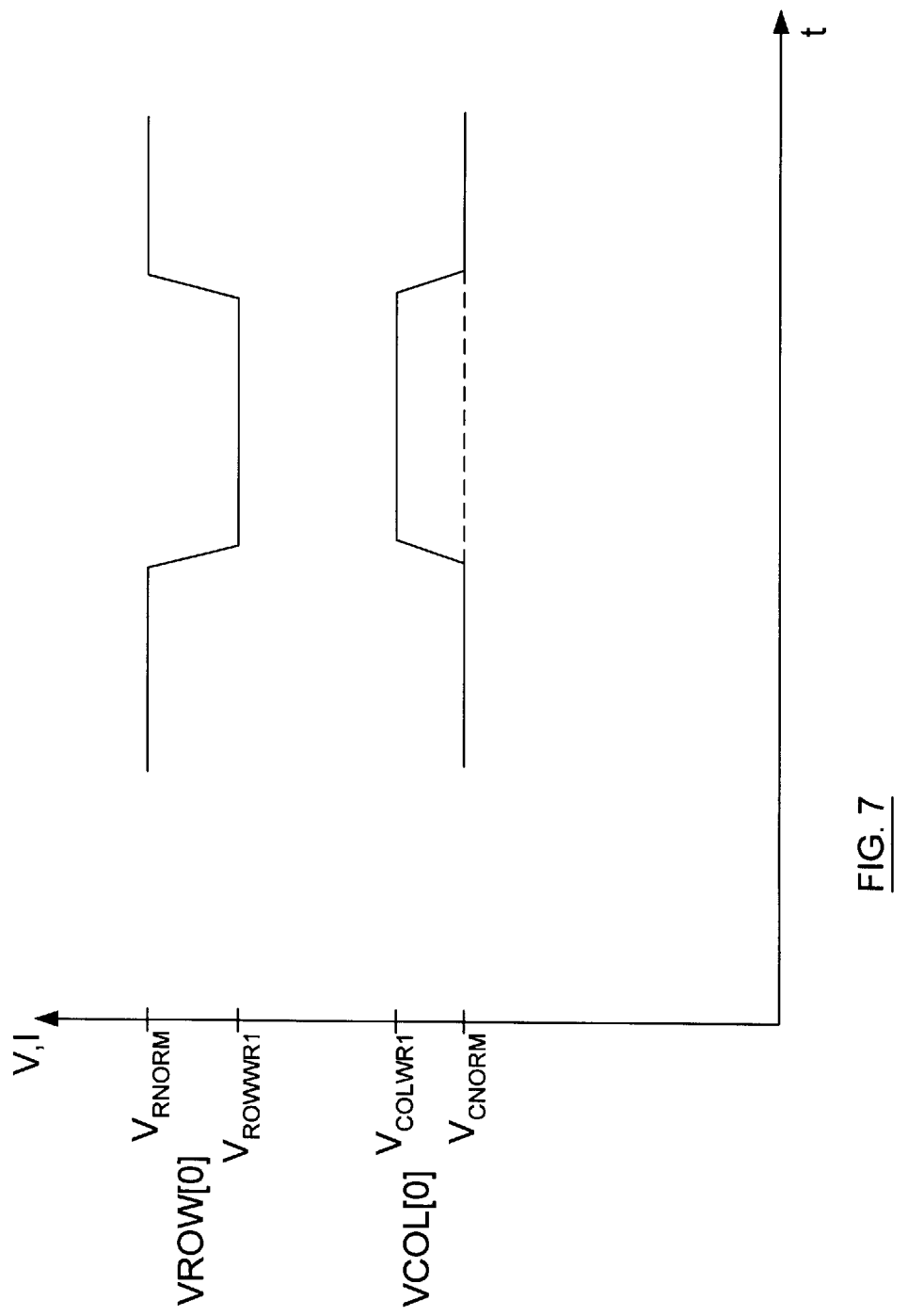
FIG. 7 illustrates representative row-supply and column supply waveforms during a write of a cell or row of cells.

FIG. 7 illustrates representative row-supply and column-supply waveforms during a write of a cell or row of cells. In FIG. 7, the row-supply line, VROW[0] starts at $V_{RNORM}$ and the column-supply line VCOL[0] starts at $V_{CNORM}$. Then, to write the cell, VROW[0] is lowered to $V_{ROWWR1}$ and VCOL[0] rises to $V_{COLWR1}$. This is shown by the solid lines in FIG. 7. The other row-supply line VNROW[0] is kept at $V_{RNORM}$ during the write and the other column-supply line is kept at $V_{CNORM}$ during the write. Therefore, these are not shown. The exact timing of the lowering of VROW[0] and the rising of VCOL[0] is not critical as long as there is a long enough period time where VROW[0] is lowered and VCOL[0] is raised to set the cell in the desired state. The dashed line for VCOL[0] that stays at $V_{CNORM}$ illustrates the waveform used when this cell is not to be set in this state. As drawn, this figure illustrates waveforms to set a cell in a first state, to set the cell in a second state, VNROW[0] would be substituted for VROW[0] and VNCOL[0] would be substituted for VCOL[0] and VROW[0] and VNCOL[0] would be kept at $V_{RNORM}$ and $V_{CNORM}$, respectively.

Figure 8:
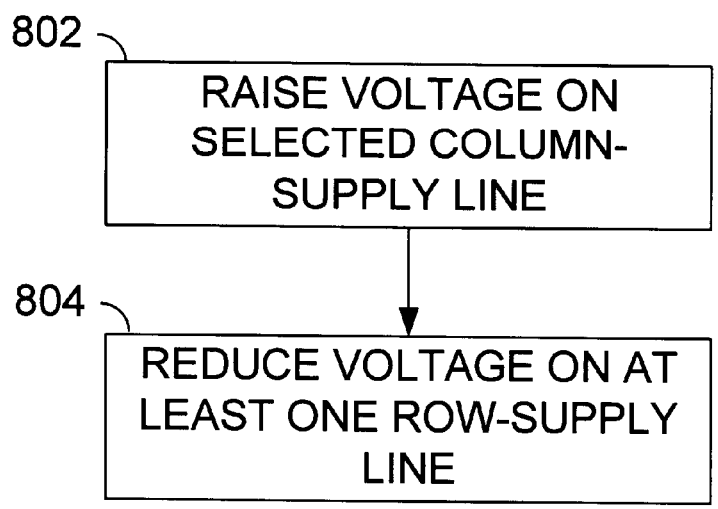
FIG. 8 illustrates steps that may be used to write the data in a cell or column of cells.

FIG. 8 illustrates steps that may be used to write the data in a cell or column of cells. In FIG. 8, in a step 802 the voltage is increased on a selected column-supply line. For example, to write a first state (i.e. the first inverter 102, 104 driving a one and the second inverter 106,108 driving a zero) into some or all of the cells in the leftmost column of FIG. 1, 100, 140, 150, the voltage on column-supply line VCOL[0] would be increased relative to the voltage on row-supply line VNCOL[0] by at least the threshold voltage of the NFETs. The other (non-selected) column-supply lines VCOL[1:M−1] and VNCOL[1:M−1] would all be maintained at a supply-like voltage (for example, the 3.3V difference from the row-supply lines mentioned above).

Using cell 100 as an example, if the first inverter 102, 104 is driving a zero (i.e. NFET 104 is on and PFET 102 is off) and the second inverter 106, 108 is driving a one (i.e. NFET 108 is off and PFET 106 is on) then the increased voltage on VCOL[0] is passed from VCOL[0] to the output node of the first inverter 110 via NFET 104. This causes the voltage between the gate of NFET 108 and the source of NFET 108 to exceed the NFET threshold voltage ($V_{TN}$) causing NPFET 108 to turn on. NFET 108 turning on causes the voltage on the output node of the second inverter 112 to fall. In the case of a read of the cell, above, this voltage is not allowed to fall enough to flip the state of the cell. However, in the case of a write, the magnitude of the voltage decrease on node 112 is increased by reducing the voltage, or allowing the voltage to fall, in a step 804 on the appropriate VROW[ ] lines (VROW[0] is the appropriate line to write this first state into cell 100, VROW[1] for cell 140, etc.) such that the voltage on the output node of the second inverter 112 drops below the trip-point of the first inverter. This flips the state of the cell into a second state where the second inverter is now driving a zero and the first inverter is now driving a one. Note that the voltage decrease on the VROW[ ] lines does not need to be extraordinarily large because the trip point of the first inverter has been increased due to the increase on its negative supply voltage and because PFET 106 is fighting against NFET 108 and lowering the VROW[ ] line decreases the ability of PFET 106 to win that fight. In the non-selected rows, these factors are not present so they are not affected by the rise on the VCOL[ ] line or lines. Note also that if, for a particular cell or group of cells in the selected column, it is not desired to set them in this first state, step 804 is not performed on those cells and they will maintain their original value as will all the cells in the non-selected columns.

If the first inverter 102, 104 were already driving a one (i.e. NFET 104 is off and PFET 102 is on) and the second inverter 106, 108 is driving a zero (i.e. NFET 108 is on and PFET 106 is off) then the increased voltage on VCOL[0] has no effect on cell 100 because the increased voltage on VCOL[0] is not passed from VCOL[0] to the output node of the first inverter 110 because NFET 104 is off and the increased voltage on VROW[0] is not passed to the output node of the second inverter 112 because PFET 106 is also off.

In order to write a second state (i.e. the first inverter 102, 104 driving a zero and the second inverter 106, 108 driving a one) into some or all of the cells in the leftmost column of FIG. 1, 100, 140, 150, the process described above is followed except that the voltage on column-supply line VNCOL[0] would be increased relative to the voltage on column-supply line VCOL[0] (instead of the other way around) by at least the threshold voltage of the NFETs in step 802. The other (non-selected) column-supply lines VCOL[1:M−1] and VNCOL[1:M−1] would still all be maintained at a supply-like voltage. Then in step 804, the row-supply line that is lowered, or allowed to fall, in order to set the cell 100 in this second state would be VNROW[0] (instead of VROW[0]).

Since different row-supply and column-supply lines need to be manipulated to write the first state and second state into cells in the same column, a two-step process may be used to write arbitrary data into multiple cells of a column. To write this arbitrary data, all the cells that are to contain one state (for example, the first state) are written, then all the cell that are to contain the other state (for example, the second state) are written. The advantage of this two-step process is that it allows arbitrary data to be written into only portions of a column. For example, to write only one byte (or nibble, or word, or arbitrary bits, etc.), the two step process would be performed only on the cells of that byte. The row-supply lines for the other cells would not be manipulated and would therefore retain their original values. This is unlike many conventional RAM arrays.

Figure 9:
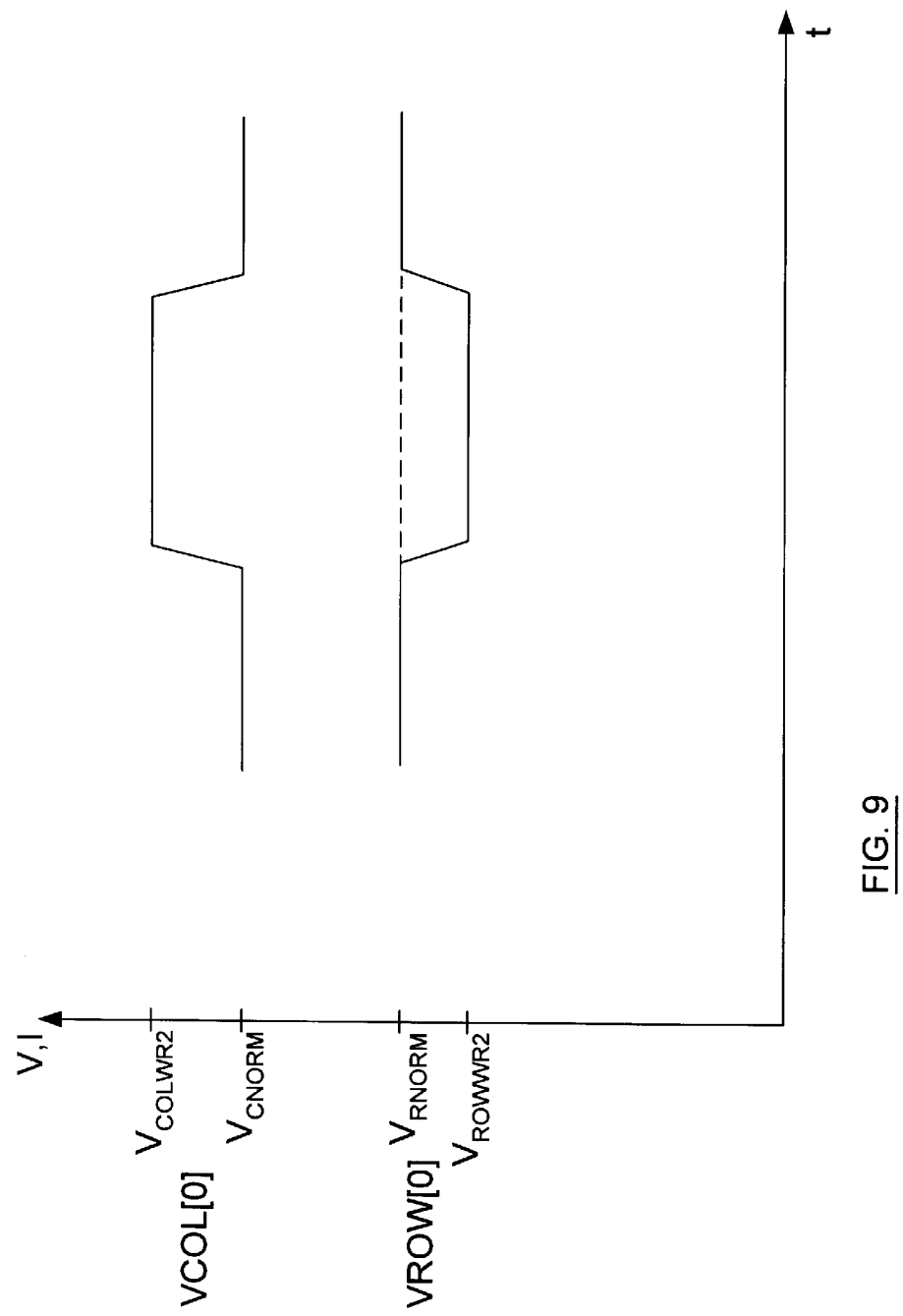
FIG. 9 illustrates representative row-supply and column-supply waveforms during a write of a cell or column of cells.

FIG. 9 illustrates representative row-supply and column-supply waveforms during a write of a cell or column of cells. In FIG. 9, the column-supply line, VCOL[0] starts at $V_{CNORM}$ and the row-supply line VROWL[0] starts at $V_{RNORM}$. Then, to write the cell, VCOL[0] is raised to $V_{COLWR2}$ and VROW[0] decreases to $V_{ROWWR2}$. This is shown by the solid lines in FIG. 9. The other column-supply line VNCOL[0] is kept at $V_{CNORM}$ during the write and the other row-supply line is kept at $V_{RNORM}$ during the write. Therefore, these are not shown. The exact timing of the increasing of VCOL[0] and the falling of VROW[0] is not critical as long as there is a long enough period time where VCOL[0] is raised and VROW[0] is lowered to set the cell in the desired state. The dashed line for VROW[0] that stays at $V_{RNORM}$ illustrates the waveform used when this cell is not to be set in this state. As drawn, this figure illustrates waveforms to set a cell in a first state, to set the cell in a second state, VNCOL[0] would be substituted for VCOL[0] and VNROW[0] would be substituted for VROW[0] and VCOL[0] and VNROW[0] would be kept at $V_{CNORM}$ and $V_{RNORM}$, respectively.

Figure 10:
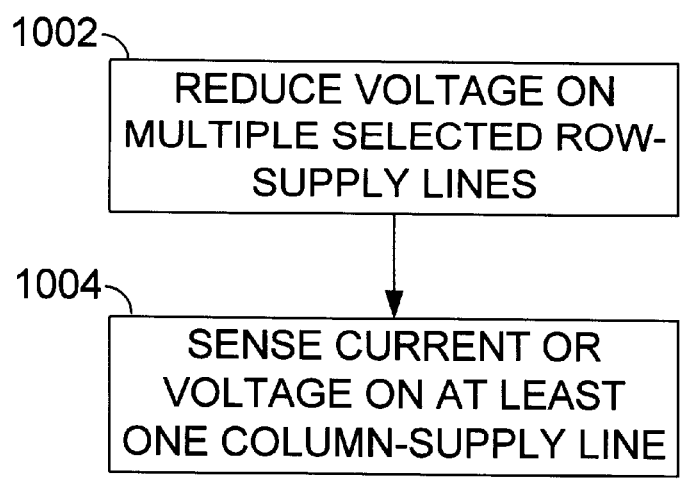
FIG. 10 illustrates steps that may be used to read and logically OR or AND the data in a column of cells.

FIG. 10 illustrates steps that may be used to read and logically OR or AND the data in a column of cells. In FIG. 10, in a step 1002 the voltage is reduced on multiple selected row-supply lines. For example, to logically OR the contents of the cells in the leftmost column of FIG. 1, 100, and 140, the voltage on row-supply line VROW[0] and VROW[1] would be reduced relative to the voltage on row-supply lines VNROW[0] and VNROW[1], respectively, by at least the threshold voltage of the PFETs. The other row-supply lines VROW[2:M−1] and VNROW[2:M−1] would all be maintained at a supply-like voltage (for example, the 3.3V difference from the column-supply lines mentioned above). As in a regular row read (detailed in the discussions of FIG. 2 and FIG. 3) if cell 100 is in a state where the first inverter 102, 104 is driving a zero, then lowering VROW[0] causes current to flow from VNROW[0] to VCOL[0] causing an increase in the current ICOL[0]. Likewise, if cell 140 is in a state where the first inverter 102, 104 is driving a zero, then lowering VROW[1] causes current to flow from VNROW[1] to VCOL[0] also causing an increase in the current ICOL[0]. Since these two currents are in the same direction, they are additive. Therefore, only if both of the cells 100 and 140 are in a state where their first inverters are driving ones will there not be an increase in the current ICOL[0]. If the state where the first inverters driving ones is defined as the cell holding a one, and the current ICOL[0] not increasing is defined as a logical one output state, and the increased current ICOL[0] defined as a logical zero output state, then the current ICOL[0] will reflect the logical AND of the state of all the selected cells in the leftmost column (in this example, 100 and 140).

This process works just as well for the other columns. A set of rows is selected, and the columns output the logical AND of the contents of the cells in that column that were selected. This is called the logical AND, by column, of the selected rows. Similarly, using the same definition for when a cell is holding a one (i.e. the first inverter driving a one) the logical OR, by column, of the contents of cells in a set of selected rows may be computed by using the VNROW[ ] lines to select rows and examining the current INCOL[ ].

Also, if the state where the first inverters driving ones is defined as the cell holding a zero, and the current ICOL[0] not increasing is defined as a logical zero output state, and the increased current ICOL[0] defined as a logical one output state, then the current ICOL[0] will reflect the logical OR of the state of all the selected cells in the leftmost column (in this example, 100 and 140). In other words, this set of definitions results in the logical OR, by column, of the selected rows but uses the VROW[ ] lines for selection. Likewise, using the same definition for when a cell is holding a zero (i.e. the first inverter driving a one) the logical AND of selected rows may be computed by using the VNROW[ ] lines to select rows and examining the current INCOL[0]. Other combinations involving the definition of which states of the cells represent which logical value (i.e.

"0" or "1"), the currents ICOL[ ] and INCOL[ ], and which lines (VROW[ ] or VNROW[ ]) are used to select the rows may be constructed to determine other logical functions such as NAND and NOR of the contents of the cells in a column.

Figure 11:
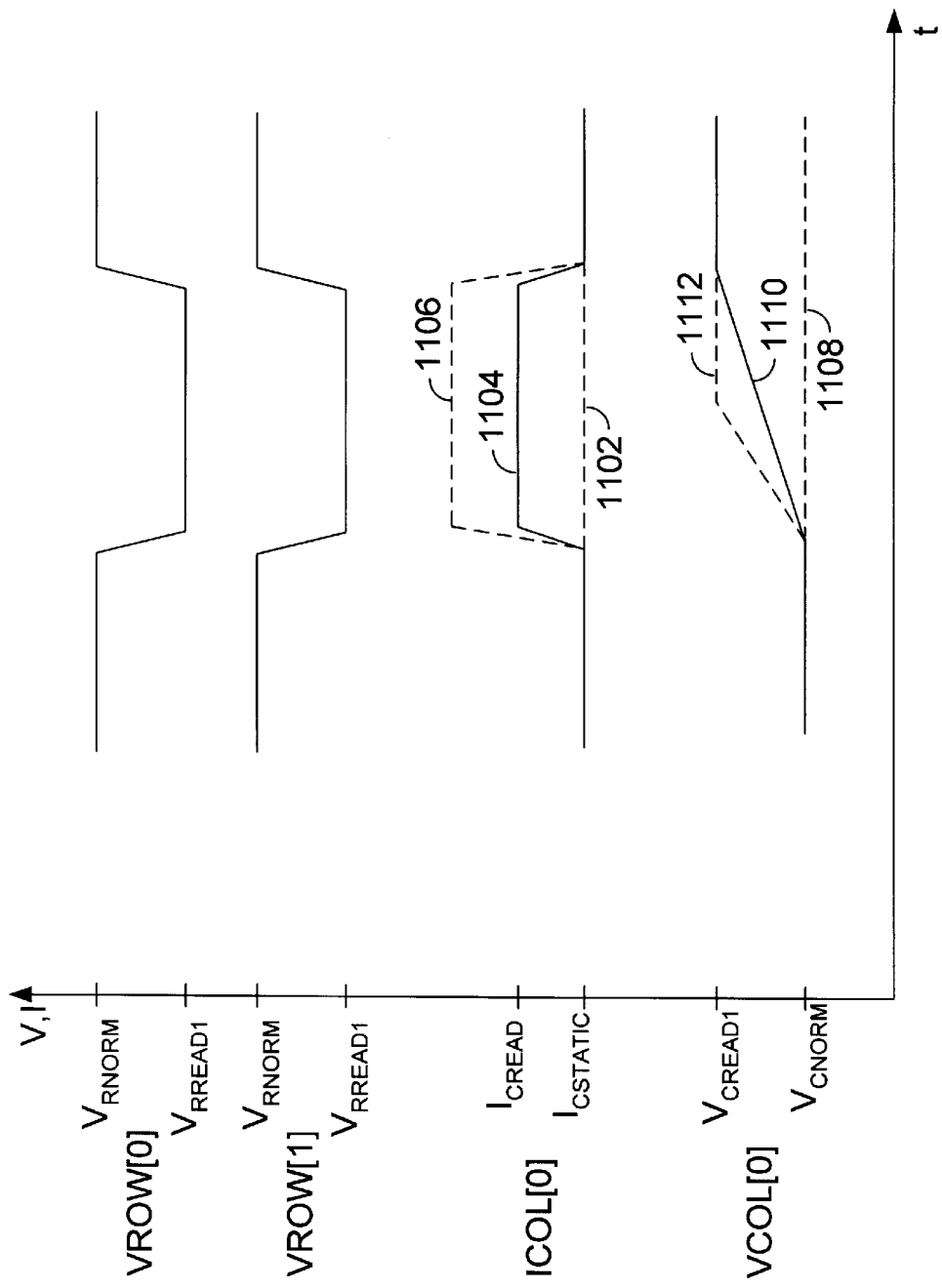
FIG. 11 illustrates representative row-supply and column-supply waveforms during a read and logical OR or AND a column of cells.

FIG. 11 illustrates representative row-supply and column-supply waveforms during a read and logical OR or AND a column of cells. In FIG. 11, VROW[0] and VROW[1] start at their normal operating voltage $V_{RNORM}$. After starting at $V_{RNORM}$ VROW[0] and VROW[1] are then shown dropping to a second voltage, $V_{RREAD1}$. $V_{RREAD1}$ is a voltage that is low enough to turn on one of the PFETs of a cell when the other row-supply line for that cell is kept at $V_{RNORM}$. That means that $V_{RREAD1}$ should be at least a PFET threshold voltage lower that $V_{RNORM}$. After a period of time, VROW [0] and VROW[1] are then shown returning from $V_{RREAD1}$ to $V_{RNORM}$. The exact timing of the drops and rises of VROW[0] and VROW[1] relative to each other is not critical as long as they are both at their reduced voltage levels for some period of time long enough to read either the voltage or current on the VCOL[ ] or VNCOL[ ] lines. The current flowing out of column-supply line VCOL[0], ICOL [0] is shown at $I_{CSTATIC}$ at the start when both VROW[0] and VROW[1] are at $V_{RNORM}$. Then, shortly after VROW[0] and VROW[1] drop by at least $V_{TP}$, ICOL[0] will either rise to at least $I_{CREAD}$ (when, because of their states, only one cell is dumping current onto the column-supply line as represented by the solid line 1104), rise above $I_{CREAD}$ (when, because of their states, more than one cell is dumping current onto the column-supply line as represented by dashed line 1106) or stay approximately the same (when, because of their states, no cells are dumping non-static current onto the column-supply line as represented by dashed line 1102) depending upon the state of cells 100 and 140. When VROW[0] and VROW[1] return to $V_{RNORM}$, the lines 1104 and 1106 return to the $I_{CSTATIC}$ level.

As stated earlier, if ICOL[0] is run through an impedance, or allowed to charge a capacitance such as is on the column-supply line VCOL[0], it may produce a detectable voltage change or difference on the VCOL[ ] or VNCOL[ ] lines. This also true when performing logic functions on the contents of the cells in a column. One possible set of voltage waveforms is labeled VCOL[0] in FIG. 11. These waveforms starts at $V_{CNORM}$. If ICOL[0] rose to $I_{CREAD}$ waveforms similar to 1110 and 1112 may be followed with VCOL[0] rising to $V_{CREAD1}$. Waveform 1112 rises faster to $V_{CREAD}$ than waveform 1110 and is intended to represent the case when more than one cell in the column is dumping current onto the column-supply line, such as is shown with waveform 1106. VCOL[0] may be clamped to limit its rise to just$V_{CREAD1}$. If ICOL[0] remained at $I_{CSTATIC}$, then VCOL[0] is shown (by the dashed line 1108) staying at $V_{CNORM}$.

Figure 12:
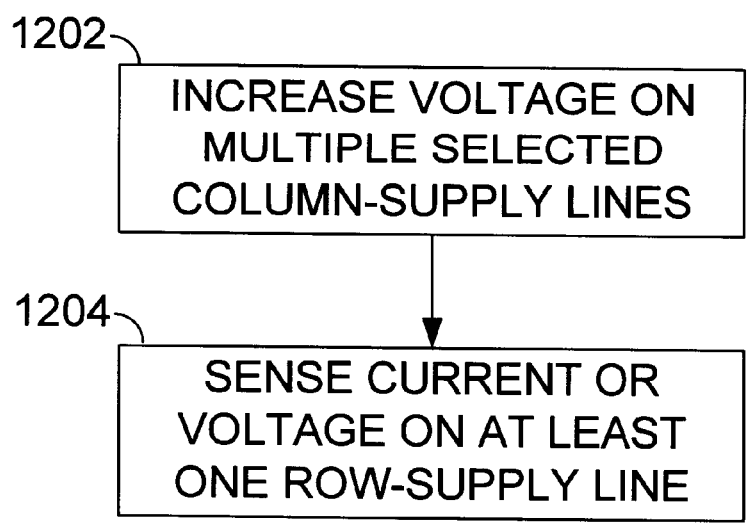
FIG. 12 illustrates steps that may be used to read and logically OR or AND the data in a row of cells.

FIG. 12 illustrates steps that may be used to read and logical OR or AND the data in a row of cells. In FIG. 12, in a step 1202 the voltage is increased on multiple selected column-supply lines. For example, to logically OR the contents of the cells in the top row of FIG. 1, 100, and 120, the voltage on column-supply line VCOL[0] and VCOL[1] would be increased relative to the voltage on column-supply lines VNCOL[0] and VNCOL[1], respectively, by at least the threshold voltage of the NFETs. The other column-supply lines VCOL[2:M−1] and VNCOL[2:M−1] would all be maintained at a supply-like voltage (for example, the 3.3V difference from the row-supply lines mentioned above). As in a regular column read (detailed in the discussions of FIG. 4 and FIG. 5) if cell 100 is in a state where the first inverter 102, 104 is driving a zero, then raising VCOL [0] causes current to flow from VROW[0] to VNCOL[0] causing an increase in the current IROW[0]. Likewise, if cell 140 is in a state where the first inverter 102, 104 is driving a zero, then raising VCOL[1] causes current to flow from VROW[0] to VNCOL[1] also causing an increase in the current IROW[0]. Since these two currents are in the same direction, they are additive. Therefore, only if both of the cells 100 and 120 are in a state where their first inverters are driving ones will there not be an increase in the current IROW[0]. If the state where the first inverters driving ones is defined as the cell holding a one, and the current IROW[0] not increasing is defined as a logical one output state, and the increased current IROW[0] defined as a logical zero output state, then the current IROW[0] will reflect the logical AND of the state of all the selected cells in the topmost row (in this example, 100 and 120).

This process works just as well for the other rows. A set of columns is selected, and the rows output the logical AND of the contents of the cells in that row that were selected. This is called the logical AND, by row, of the selected columns. Similarly, using the same definition for when a cell is holding a one (i.e. the first inverter driving a one) the logical OR, by row, of the contents of cells in a set of selected columns may be computed by using the VNCOL[ ] lines to select columns and examining the current INROW[ ].

Also, if the state where the first inverters driving ones is defined as the cell holding a zero, and the current IROW[0] not increasing is defined as a logical zero output state, and the increased current IROW[0] defined as a logical one output state, then the current IROW[0] will reflect the logical OR of the state of all the selected cells in the topmost row (in this example, 100 and 120). In other words, this set of definitions results in the logical OR, by row, of the selected columns but uses the VCOL[ ] lines for selection. Likewise, using the same definition for when a cell is holding a zero (i.e. the first inverter driving a one) the logical AND of selected columns may be computed by using the VNCOL[ ] lines to select columns and examining the current INROW[0]. Other combinations involving the definition of which states of the cells represent which logical value (i.e. "0" or "1"), the currents IROW[ ] and INROW[ ] and which lines (VCOL[ ] or VNCOL[ ]) are used to select the columns may be constructed to determine other logical functions such as NAND and NOR of the contents of the cells in a column.

Figure 13:
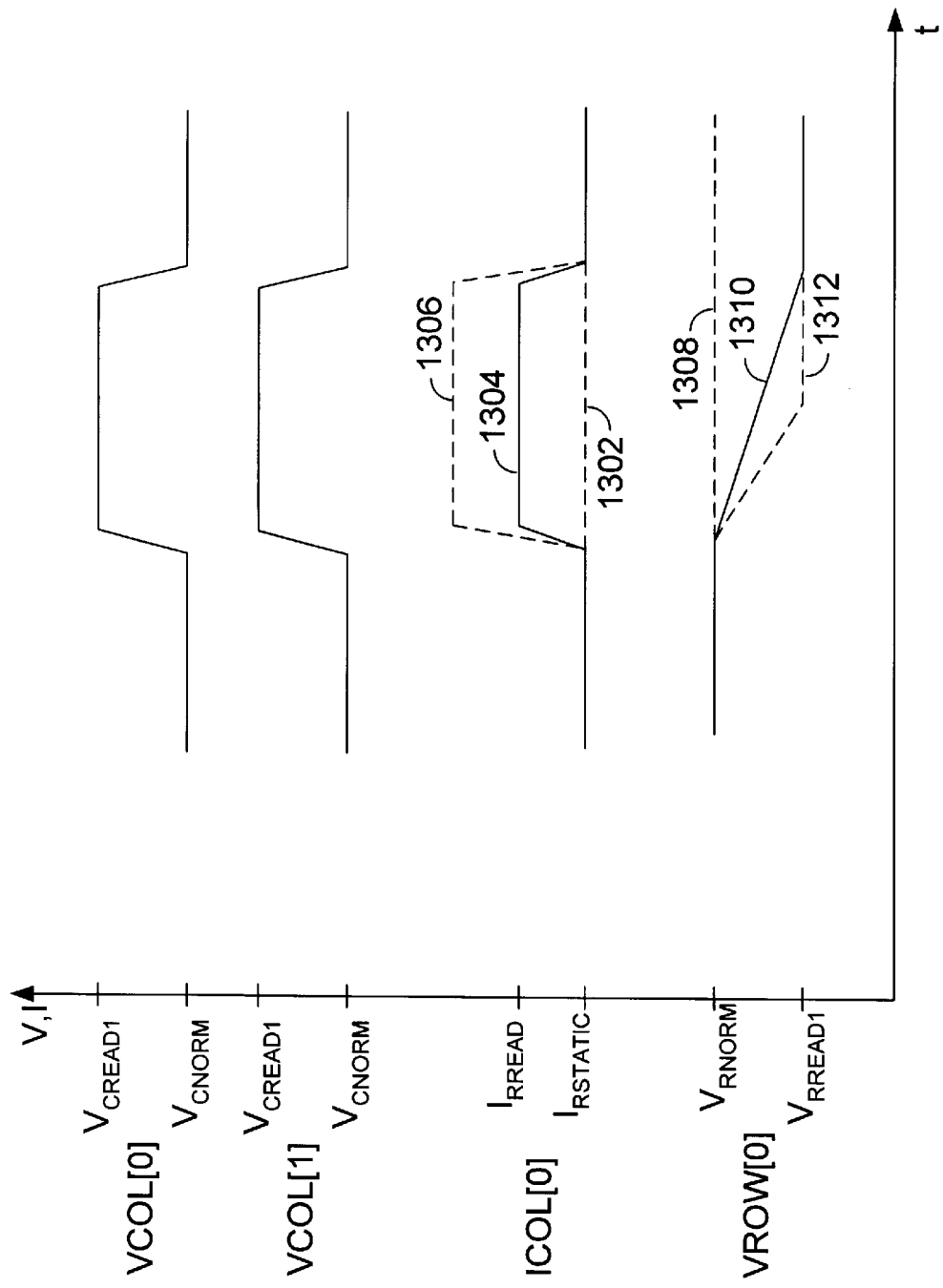
FIG. 13 illustrates representative row-supply and column-supply waveforms during a read and logical OR or AND a row of cells.

FIG. 13 illustrates representative row-supply and column-supply waveforms during a read and logical OR or AND a row of cells. In FIG. 13, VCOL[0] and VCOL[1] start at their normal operating voltage $V_{CNORM}$. After starting at $V_{CNORM}$ VCOL[0] and VCOL[1] are then shown rising to a second voltage, $V_{CREAD1}$. $V_{CREAD1}$ is a voltage that is high enough to turn on one of the NFETs of a cell when the other column-supply line for that cell is kept at $V_{CNORM}$. That means that $V_{CRELAD1}$ should be at least a NFET threshold voltage lower that $V_{CNORM}$. After a period of time, VCOL [0]and VCOL[1] are then shown returning from $V_{CREAD1}$ to $V_{CNORM}$. The exact timing of the drops and rises of VCOL [0] and VCOL[1] relative to each other is not critical as long as they are both at their increased voltage levels for some period of time long enough to read either the voltage or current on the VROW[ ] or VNROW[ ] lines. The current flowing into row-supply line VROW[0], IROW[0] is shown at $I_{RSTATIC}$ at the start when both VCOL[0] and VCOL[1] are at $V_{CNORM}$ Then, shortly after VCOL[0] and VCOL[1] rise by at least $V_{TN}$, IROW[0] will either rise to at least $I_{RREAD}$ (when, because of their states, only one cell is pulling current from the row-supply line as represented by the solid line 1304), rise above $I_{RREAD}$ (when, because of their states, more than one cell is pulling current from the row-supply line as represented by dashed line 1306), or stay approximately the same (when, because of their states, no cells are pulling non-static current from the row-supply line as represented by dashed line 1302) depending upon the state of cells 100 and 120. When VCOL[0] and VCOL[1] return to $V_{CNORM}$, the lines 1304 and 1306 return to the $I_{RSTATIC}$ level.

As stated earlier, if IROW[0] is run through an impedance, or allowed to discharge a capacitance such as is on the row-supply line VROW[0], it may produce a detectable voltage change or difference on the VROW[ ] or VNROW[ ] lines. This is also true when performing logic functions on the contents of the cells in a row. One possible set of voltage waveforms is labeled VROW[0] in FIG. 13. These waveforms starts at $V_{RNORM}$. If IROW[0] rose to $I_{RREAD}$ waveforms similar to 1310 and 1312 may be followed with VCOL[0] dropping to $V_{RREAD1}$. Waveform 1312 drops faster to $V_{RREAD1}$ than waveform 1310 and is intended to represent the case when more than one cell in the row is pulling current from the row-supply line, such as is shown with waveform 1306. VROW[0] may be clamped to limit its drop to just $V_{RREAD1}$. If IROW[0] remained at $I_{RSTATIC}$, then VROW[0] is shown (by the dashed line 1308) staying at $V_{RNORM}$.

Figure 14:
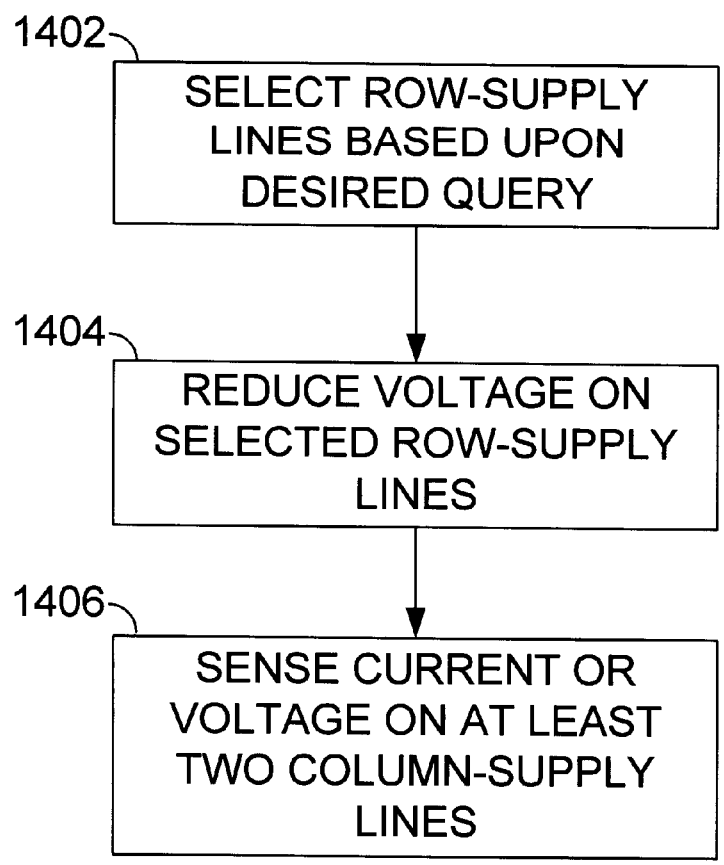
FIG. 14 illustrates steps that may be used to query the columns of an array of four-transistor memory cells as a content-addressable memory.

FIG. 14 illustrates steps that may be used to query the columns of an array of four-transistor memory cells as a content-addressable memory. In FIG. 14, in a step 1402 row-supply lines are selected for voltage reduction based upon the query pattern desired. For each cell in a column to be queried, one of VROW[ ] or VNROW[ ] is selected depending upon whether a zero or one state in the cell should result in a match. For example, if the first inverter driving a zero is defined as cell 100 holding a one, then the row-supply line selected for a particular row of cells would be the VNROW[ ] to look for matches to that one state. To look for matches to the zero state (i.e. the first inverter driving a one), the VROW[ ] line would be selected. If it is desired not to query a row or rows (i.e. not include a row or rows of cells in the pattern match), then neither VROW[ ] or VNROW[ ] for those rows would be selected.

In a step 1404, the voltage is reduced on a selected row-supply lines. For example, to query the cells in the top row of FIG. 1, 100, 120, 130, for the state where the first inverter is driving a one, and to query the cells in the second row 140, 144, 146 of FIG. 1 for the state where the first inverter is driving a zero, the voltage on row-supply line VROW[0] would be reduced relative to the voltage on row-supply line VNROW[0] by at least the threshold voltage of the PFETs and VNROW[1] would be reduced relative to the voltage on row-supply line VROW[1]. In other words, VROW[0] and VNROW[1] were the row-supply lines selected in the previous step. The other row-supply lines VROW[2:M−1] and VNROW[2:M−1] would be maintained at a supply-like voltage (for example, the 3.3V difference from the column-supply lines mentioned above) provided they are not part of the desired query.

If the contents of the queried cells in a given column match the query, then neither VCOL[ ] or VNCOL[ ] line will show an increase in current (i.e. ICOL[ ] or INCOL[ ]) or voltage. Using the above as an example, if cell 100 has its first inverter driving a one and cell 140 has its first inverter driving a zero, and VROW[0] and VNROW[1] are the selected row-supply lines (from step 1402), then the reduced voltages on VROW[0] and VNROW[1] will not cause a significant increase in ICOL[0] or INCOL[0] (or a voltage increase on VCOL[0] or VNCOL[0]). Accordingly, this lack of increase on both column-supply lines for a given column indicates that the query has matched the contents of the cells in that column. Unlike a regular read, logical OR, or logical AND, since both column-supply lines must show this lack of increase in current (or voltage) it is necessary to sense both column-supply lines to see if there was a match to the query.

If the contents of the queried cell in a given column do not match the query, then one or both of VCOL[ ] or VNCOL[ ] lines will show an increase in current (i.e. ICOL[ ] or INCOL[ ]) or voltage. Using the same query above as an example, if cell 120 has its first inverter driving a one, and VROW[0] is a selected row-supply line (from step 1402), then the reduced voltage on VROW[0] will cause a detectable increase in ICOL[1] (or voltage increase on VCOL[1]). This increase indicates that the query did not match the contents of at least one cell in that column (i.e. in this case, at least the contents of cell 120 did not match). Likewise, if cell 144 has its first inverter driving a zero, and VNROW[ ] is a selected row-supply line (from step 1402), then the reduced voltage on VNROW[1] will cause a detectable increase in INCOL[1] (or voltage increase on VNCOL[1]. This increase indicates that the query did not match the contents of at least one cell in that column (i.e. in this case, at least the content of cell 144 did not match). If more than one cell in a column does not match the query, it is possible for both column-supply lines for that column to show a detectable increase in current.

Figure 15:
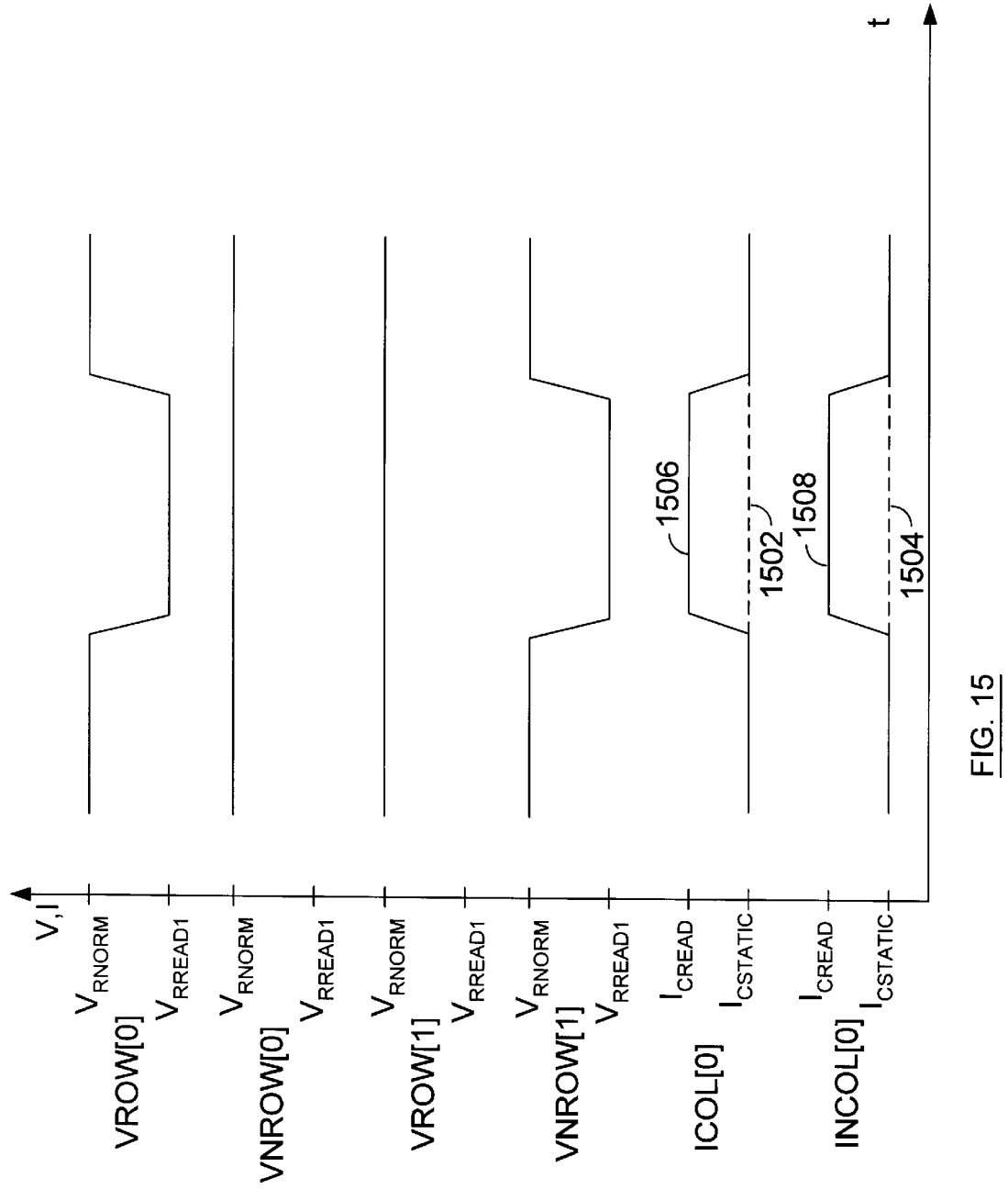
FIG. 15 illustrates representative row-supply and column-supply waveforms to query the columns of an array of four-transistor memory cells as a content addressable memory.

FIG. 15 illustrates representative row-supply and column-supply waveforms to query the columns of an array of four-transistor memory cells as a content addressable memory. In FIG. 15, VROW[0], VNROW[0], VROW[1] and VNROW[1] start at their normal operating voltage $V_{RNORM}$. After starting at $V_{RNORM}$ VROW[0] and VNROW[1] are then shown dropping to a second voltage, $V_{RREAD1}$. $V_{RREAD1}$ is a voltage that is low enough to turn on one of the PFETs of a cell when the other row-supply line for that cell is kept at $V_{RNORM}$. That means that $V_{RREAD1}$ should be at least a PFET threshold voltage lower that $V_{RNORM}$. After a period of time, VROW[0] and VNROW[1] are then shown returning from $V_{RREAD1}$ to $V_{RNORM}$. The exact timing of the drops and rises of VROW[0] and VNROW[ 1] relative to each other is not critical as long as they are both at their reduced voltage levels for some period of time long enough to read either the voltage or current on the VCOL[ ] and VNCOL[ ]lines. The current flowing out of column-supply line VCOL[0], ICOL[0] and VNCOL[0], INCOL[0] is shown at $I_{CSTATIC}$ at the start when both VROW[0] and VROW[1] are at $V_{RNORM}$. Then, shortly after VROW[0] and VNROW[1] drop by at least $V_{TP}$, ICOL[0] and INCOL[0] will either rise to at least $I_{CREAD}$ (when, because of their states, only one cell is dumping current onto the column-supply line as represented by the solid lines 1506 and 1508), rise above $I_{CREAD}$ (when, because of their states, more than one cell is dumping current onto the column-supply line) or stay approximately the same (when, because of their states, no cells are dumping non-static current onto the column-supply line as represented by dashed lines 1502 and 1504) depending upon the state of cells 100 and 140. When VROW[0] and VNROW[1] return to $V_{RNORM}$, the lines 1504 and 1506 return to the $I_{CSTATIC}$ level. Dashed lines 1502 and 1504 represent what happens when the query and the contents of the cells match.

Figure 16:
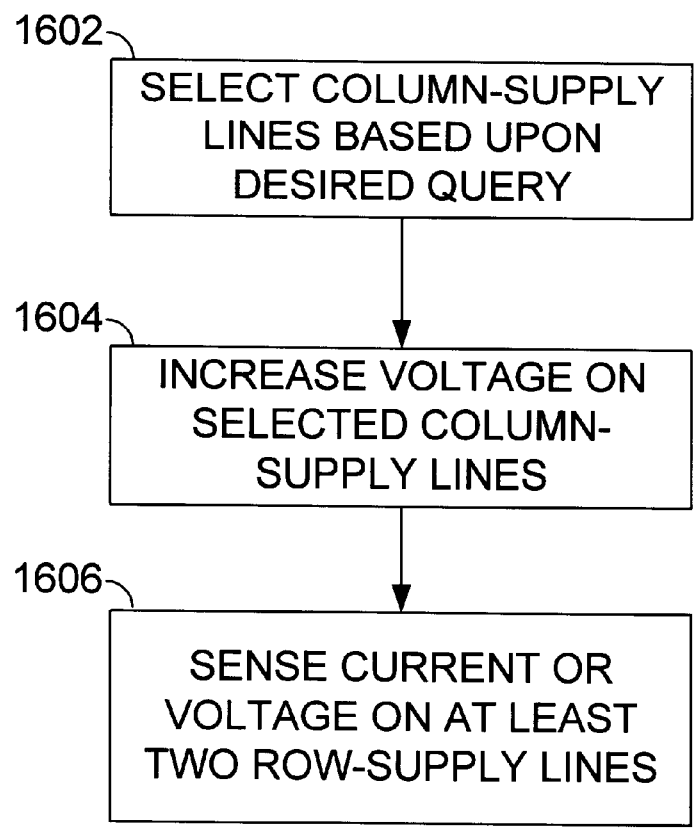
FIG. 16 illustrates steps that may be used to query the rows of an array of four-transistor memory cells as a content-addressable memory.

FIG. 16 illustrates steps that may be used to query the rows of an array of four-transistor memory cells as a content-addressable memory. In FIG. 16, in a step 1602 column-supply lines are selected for increased voltage based upon the query pattern desired. For each cell in a row to be queried, one of VCOL[ ] or VNCOL[ ] is selected depending upon whether a zero or one state in the cell should result in a match. For example, if the first inverter driving a zero is defined as cell 100 holding a one, then the column-supply line selected for a particular row of cells would be the VNCOL[ ] to look for matches to that one state. To look for matches to the zero state (i.e. the first inverter driving a one), the VCOL[ ] line would be selected. If it is desired not to query a column or columns (i.e. not include a column or columns of cells in the pattern match), then neither VCOL[ ] or VNCOL[ ] for those rows would be selected.

In a step 1604, the voltage is increased on the selected column-supply lines. For example, to query the cells in the leftmost column of FIG. 1, 100, 140, 150, for the state where the first inverter is driving a one, and to query the cells in the second column 120, 144, 154 of FIG. 1 for the state where the first inverter is driving a zero, the voltage on column-supply line VCOL[0] would be increased relative to the voltage on column-supply line VNCOL[0] by at least the threshold voltage of the NFETs and VNCOL[1] would be increased relative to the voltage on column-supply line VCOL[1]. In other words, VCOL[0] and VNCOL[1] were the column-supply lines selected in the previous step. The other column-supply lines VCOL[2:N−1] and VNCOL[2:N−1] would be maintained at a supply-like voltage (for example, the 3.3V difference from the row-supply lines mentioned above) provided they are not part of the desired query.

If the contents of the queried cells in a given row match the query, then neither VROW[0] or VNROW[0] line will show an increase in current (i.e. IROW[0] or INROW[0]) or decrease in voltage. Using the above as an example, if cell 100 has its first inverter driving a one and cell 120 has its first inverter driving a zero, and VCOL[0] and VNCOL[1] are the selected column-supply lines (from step 1602), then the increased voltages on VCOL[0] and VNCOL[1] will not cause a significant increase in IROW[0] or INROW[0] (or a voltage decrease on VROW[0] or VNROW[0]). Accordingly, this lack of increased current on both row-supply lines for a given row indicates that the query has matched the contents of the cells in that row. Unlike a regular read, logical OR, or logical AND, since both row-supply lines must show this lack of increase in current (or decrease in voltage) it is necessary to sense both row-supply lines to see if there was a match to the query.

If the contents of the queried cell in a given row do not match the query, then one or both of VROW[0] or VNROW[0] lines will show an increase in current (i.e. IROW[0] or INROW[0]) or decrease in voltage. Using the same query above as an example, if cell 140 has its first inverter driving a one, and VCOL[0] is a selected column-supply line (from step 1602), then the increased voltage on VCOL[0] will cause a detectable increase in IROW[1] (or voltage decrease on VROW[1]). This increase indicates that the query did not match the contents of at least one cell in that row (i.e. in this case, at least the contents of cell 140 did not match). Likewise, if cell 144 has its first inverter driving a zero, and VNCOL[1] is a selected column-supply line (from step 1602), then the increased voltage on VNCOL[1] will cause a detectable increase in INROW[1] (or voltage decrease on VNROW[1]). This increase (or voltage decrease) indicates that the query did not match the contents of at least one cell in that row (i.e. in this case, at least the content of cell 144 did not match). If more than one cell in a row does not match the query, it is possible for both row-supply lines for that row to show a detectable increase in current.

Figure 17:
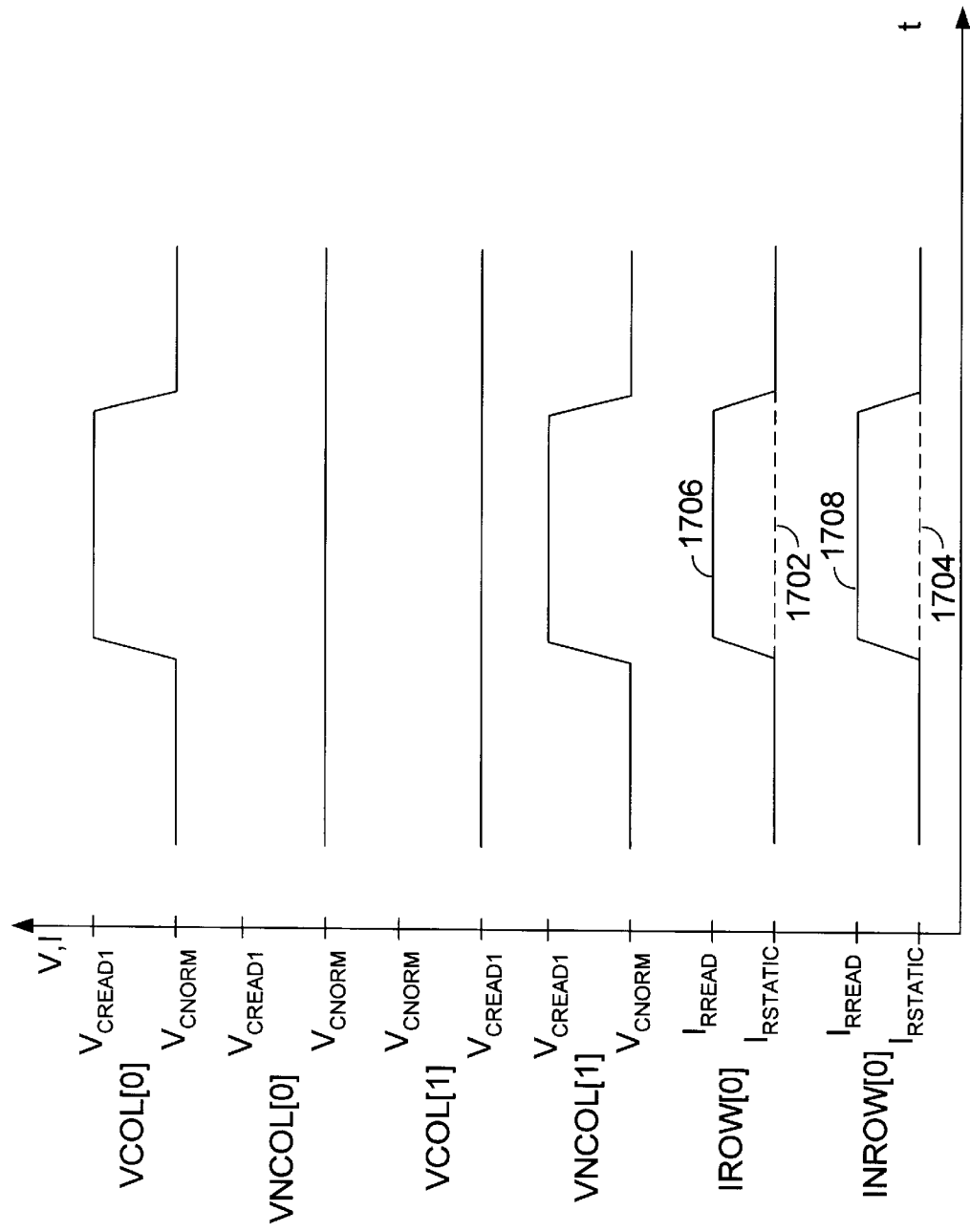
FIG. 17 illustrates representative row-supply and column-supply waveforms to query the rows of an array of four-transistor memory cells as a content addressable memory.

FIG. 17 illustrates representative row-supply and column-supply waveforms to query the rows of an array of four-transistor memory cells as a content addressable memory. In FIG. 17, VCOL[0], VNCOL[0], VCOL[1] and VNCOL[1] start at their normal operating voltage $V_{CNORM}$. After starting at $V_{CNORM}$ VCOL[0] and VNCOL[1] are then shown rising to a second voltage, $V_{CREAD1}$. $V_{CREAD1}$ is a voltage that is high enough to turn on one of the NFETs of a cell when the other column-supply line for that cell is kept at $V_{CNORM}$. That means that $V_{CREAD1}$ should be at least a NFET threshold voltage higher that $V_{CNORM}$. After a period of time, VCOL[0] and VNCOL[1] are then shown returning from $V_{CREAD1}$ to $V_{CNORM}$. The exact timing of the drops and rises of VCOL[0] and VNCOL[1] relative to each other is not critical as long as they are both at their increased voltage levels for some period of time long enough to read either the voltage or current on the VROW[0] and VNROW[0] lines. The current flowing into the row-supply line VROW[0], IROW[0], and the current flowing into the row-supply line VNROW[0], INROW[0] is shown at $I_{RSTATIC}$ at the start when both VCOL[0] and VCOL[1] are at $V_{CNORM}$. Then, shortly after VCOL[0] and VNCOL[1] rise by at least $V_{TN}$, IROW[0] and INROW[0] will either rise to at least $I_{RREAD}$ (when, because of their states, only one cell is pulling current from the row-supply line as represented by the solid lines 1706 and 1708), rise above $I_{RREAD}$ (when, because of their states, more than one cell is pulling current from the row-supply line), or stay approximately the same (when, because of their states, no cells are pulling non-static current from the row-supply line as represented by dashed lines 1702 and 1704) depending upon the state of cells 100 and 120. When VCOL[0] and VNCOL[1] return to $V_{CNORM}$, the lines 1704 and 1706 return to the $I_{RSTATIC}$ level. Dashed lines 1702 and 1704 represent what happens when the query and the contents of the cells in the row match.

What is claimed is:

1. A method of writing a memory array, comprising:
   creating a first voltage differential between a first row-supply line and a second row-supply line; and,
   creating a second voltage differential between a first column-supply line and a second column-supply line.

2. The method of claim 1 wherein said first voltage differential is at least a first threshold voltage of a first type of field-effect transistor in magnitude and said second voltage differential is less than said a second threshold voltage of a second type of field-effect transistor in magnitude.

3. The method of claim 1 wherein said first row-supply line and said first column-supply line are connected to a first inverter and said first voltage differential comprises said first row-supply line being at a greater voltage than said second row-supply line and said second voltage differential comprises said first column-supply line being at a greater voltage than said second colunm-supply line.

4. The method of claim 3, further comprising:
   creating a third voltage differential between said first row-supply line and said second row-supply line; and,
   creating a fourth voltage differential between said first column-supply line and said second column-supply line, wherein said third voltage differential comprises said second row-supply line being at a greater voltage than said first row-supply line and said fourth voltage differential comprises said second column-supply line being at a greater voltage than said first column-supply line.

5. The method of claim 1, further comprising:
   creating a third voltage differential between said first row-supply line and said second row-supply line; and,
   creating a fourth voltage differential between said first column-supply line and said second column-supply line wherein said third voltage differential is opposite in polarity from said first voltage differential and said fourth voltage differential is opposite in polarity from said second voltage differential.

6. The method of claim 5 wherein said first voltage differential is at least a first threshold voltage of a first type of field-effect transistor in magnitude and said second voltage differential is less than said a second threshold voltage of a second type of field-effect transistor in magnitude.

7. A method of writing a memory array, comprising:
driving a first voltage differential between a first supply line and a second supply line wherein said first supply line is connected to a first inverter in a plurality cells of a row and said second supply line is connected to a second inverter in a plurality of cells of said row thereby causing a first current to flow between said first supply line and at least a third supply line when a cell of said plurality of cells in said row is in a first state; and,
driving a second voltage differential between said third supply line and a fourth supply line thereby causing said cell to switch between said first state and a second state and wherein said third supply line is connected to said first inverter and said fourth supply is connected to said second inverter.

8. The method of claim 7, wherein said step of driving a first voltage differential comprises decreasing a voltage on said second supply line relative to said first supply line.

9. The method of claim 7, wherein said step of driving a second voltage differential comprises increasing a voltage on said third supply line relative to said fourth supply line.

10. The method of claim 9, wherein said step of driving a first voltage differential comprises decreasing a voltage on said second supply line relative to said first supply line.

11. The method of claim 9, wherein said step of driving a first voltage differential comprises increasing a voltage on said first supply line relative to said second supply line.

12. A method of writing a memory array, comprising:
creating a first voltage differential between a first column-supply line and a second column-supply line; and,
creating a second voltage differential between a first row-supply line and a second row-supply line.

13. The method of claim 12 wherein said first voltage differential is at least a first threshold voltage of a first type of field-effect transistor in magnitude and said second voltage differential is less than said a second threshold voltage of a second type of field-effect transistor in magnitude.

14. The method of claim 12 wherein said first column-supply line and said first row-supply line are connected to a first inverter and said first voltage differential comprises said first column-supply line being at a greater voltage than said second column-supply line and said second voltage differential comprises said first row-supply line being at a greater voltage than said second row-supply line.

15. The method of claime 14, further comprising:
creating a third voltage differential between said first column-supply line and said second column-supply line; and,
creating a fourth voltage differential between said first row-supply line and said second row-supply line, wherein said third voltage differential comprises said second column-supply line being at a greater voltage than said-first column-supply line and said fourth voltage differential comprises said second row-supply line being at a greater voltage than said first row-supply line.

16. The method of claim 12, further comprising:
creating a third voltage differential between said first column-supply line and said second column-supply line; and,
creating a fourth voltage differential between a first row-supply line and a second row-supply line wherein said third voltage differential is opposite in polarity from said first voltage differential and said fourth voltage differential is opposite in polarity from said second voltage differential.

17. The method of claim 16 wherein said first voltage differential is at least a first threshold voltage of a first type of field-effect transistor in magnitude and said second voltage differential is less than said a second threshold voltage of a second type of field-effect transistor in magnitude.

18. A method of writing a memory array, comprising:
driving a first voltage differential between a first supply line and a second supply line wherein said first supply line is connected to a first inverter in a plurality cells of a column and said second supply line is connected to a second inverter in a plurality of cells of said column thereby causing a first current to flow between said first supply line and at least a third supply line when a cell of said plurality of cells in said column is in a first state; and,
driving a second voltage differential between said third supply line and a fourth supply line thereby causing said cell to switch between said first state and a second state and wherein said third supply line is connected to said first inverter-and said fourth supply is connected to said second inverter.

19. The method of claim 18, wherein said step of driving a first voltage differential comprises increasing a voltage on said first supply line relative to said second supply line.

20. The method of claim 18, wherein said step of driving a second voltage differential comprises decreasing a voltage on said third supply line relative to said fourth supply line.

21. A method of writing a memory array, comprising:
supplying a first supply line and a second supply line with a first operating voltage;
supplying a third supply line and a fourth supply line with a second operating voltage;
supplying a first voltage differential between said first supply line and said second supply line that is at least a threshold voltage of a first type of field-effect transistor in magnitude thereby causing at least one cell to conduct a
detectable amount of current between said first supply line and said third supply line; and, supplying a second voltage differential between said third supply line and said fourth supply line that is at least a threshold voltage of a second type of field-effect transistor in magnitude thereby causing at least one cell to change from a first logic state to a second logic state.

22. The method of claim 21 wherein said first voltage differential comprises said first supply line being at a greater voltage than said second supply line.

23. The method of claim 22 wherein said second voltage differential comprises said fourth supply line being at a greater voltage than said third supply line.

24. The method of claim 21 wherein said first voltage differential comprises said second supply line being at a greater voltage than said first supply line.

25. The method of claim 21 wherein said second voltage differential comprises said third supply line being at a greater voltage than said fourth supply line.

26. The method of claim 21 wherein said second voltage differential comprise said fourth supply line being at a greater voltage than said third supply line.

27. The method of claim 21 wherein said second voltage differential comprises said fourth supply line being at a greater voltage than said third supply line.

* * * * *